United States Patent

Scandurra

[11] 4,378,537
[45] * Mar. 29, 1983

[54] HIGH ISOLATION MULTICOUPLING APPARATUS

[76] Inventor: Aldo M. Scandurra, 22 Monett Pl., Greenlawn, N.Y. 11740

[*] Notice: The portion of the term of this patent subsequent to Aug. 11, 1998, has been disclaimed.

[21] Appl. No.: 256,410

[22] Filed: Apr. 22, 1981

Related U.S. Application Data

[63] Continuation-in-part of Ser. No. 52,410, Jun. 27, 1979, Pat. No. 4,283,695, and a continuation-in-part of Ser. No. 208,858, Nov. 21, 1980, abandoned.

[51] Int. Cl.³ .............................................. H03H 7/48
[52] U.S. Cl. .................................. 333/100; 328/105; 338/64; 338/260; 338/320; 455/6; 361/346; 361/400; 361/424
[58] Field of Search .............. 338/62, 64, 228, 252, 338/253, 260, 273, 276, 318–320; 307/91; 361/332, 346, 400, 424; 323/297, 353, 354, 367, 369; 455/3, 6, 132, 141; 330/148, 295; 328/62, 105, 165; 333/100, 124, 120

[56] References Cited

U.S. PATENT DOCUMENTS

| | | | |
|---|---|---|---|
| 2,444,037 | 6/1948 | Fritschi | 338/319 |
| 2,825,009 | 2/1958 | McCoy | 361/424 |
| 3,187,259 | 6/1965 | Scandurra et al. | |
| 3,332,038 | 7/1967 | Stanley et al. | 330/148 X |
| 3,348,160 | 10/1967 | Lee et al. | 330/148 X |
| 3,382,439 | 5/1968 | Frihart | |
| 3,392,335 | 7/1968 | Euler et al. | |
| 3,710,260 | 1/1973 | Wright | 328/105 X |
| 3,833,866 | 9/1974 | Boutelant | 333/104 |
| 3,956,699 | 5/1976 | Leahy | |

*Primary Examiner*—Paul L. Gensler
*Attorney, Agent, or Firm*—Eugene E. Geoffrey, Jr.

[57] ABSTRACT

A multicoupler for coupling a single energy source to a plurality of utilization devices including an impedance transformer connected to the source and driving at least one active device such as a pair of series connected emitter followers, a plurality of isolation networks each connected to the output of the active device with each of said isolation networks providing an output for at least one utilization device, and structural arrangements for connection of the isolation networks to the output of the active device to minimize undesirable inductive effects.

31 Claims, 14 Drawing Figures

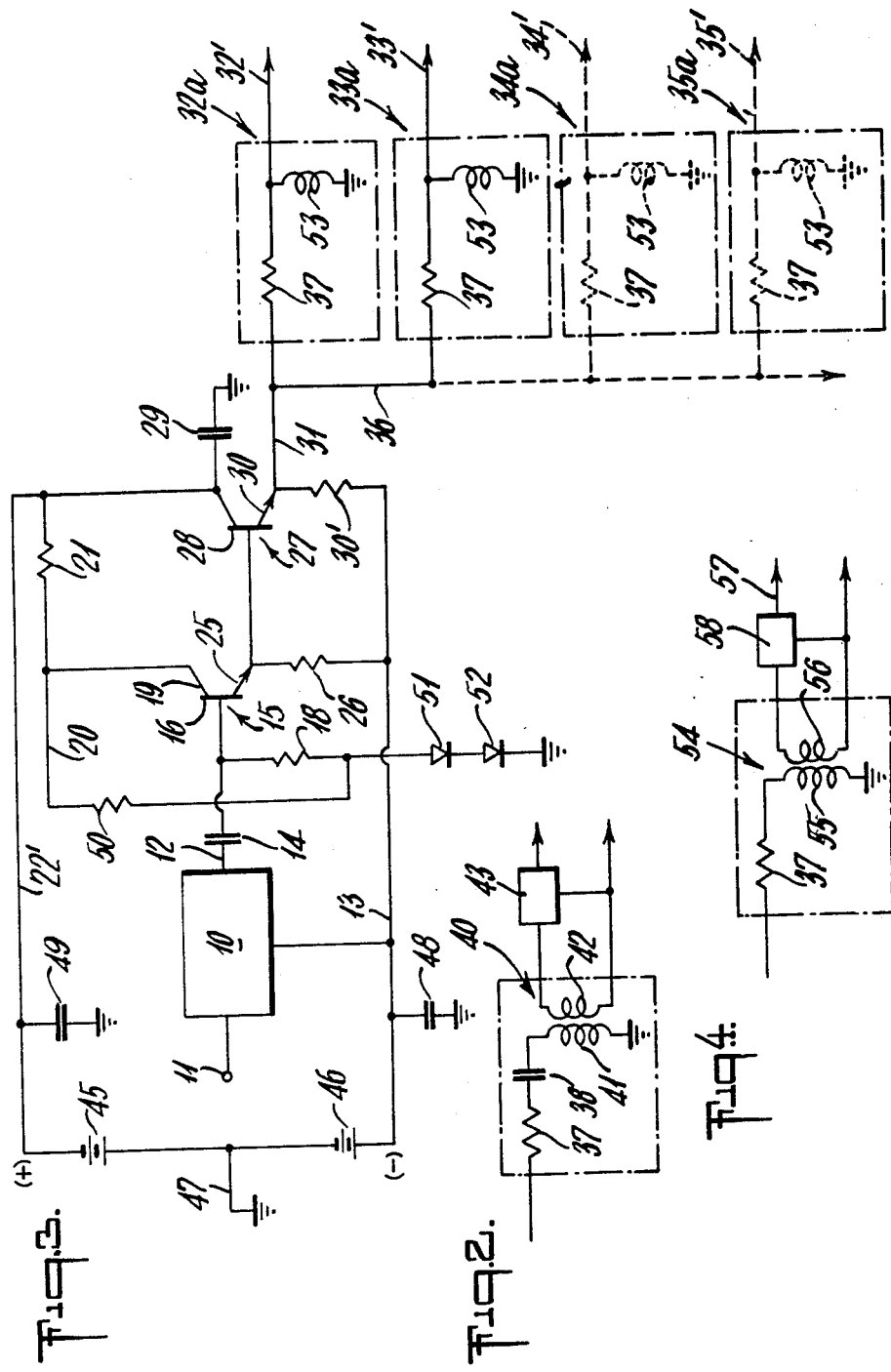

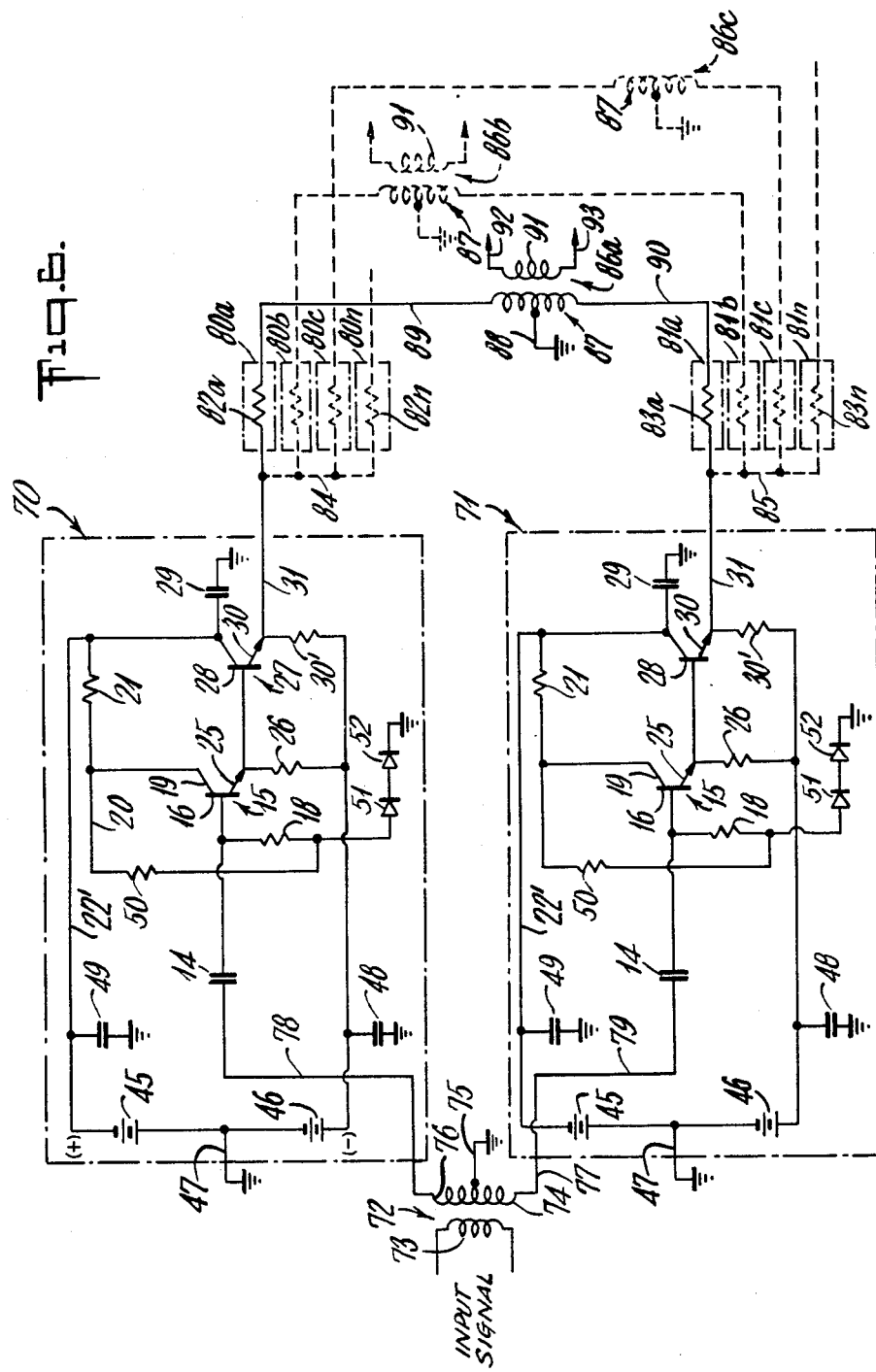

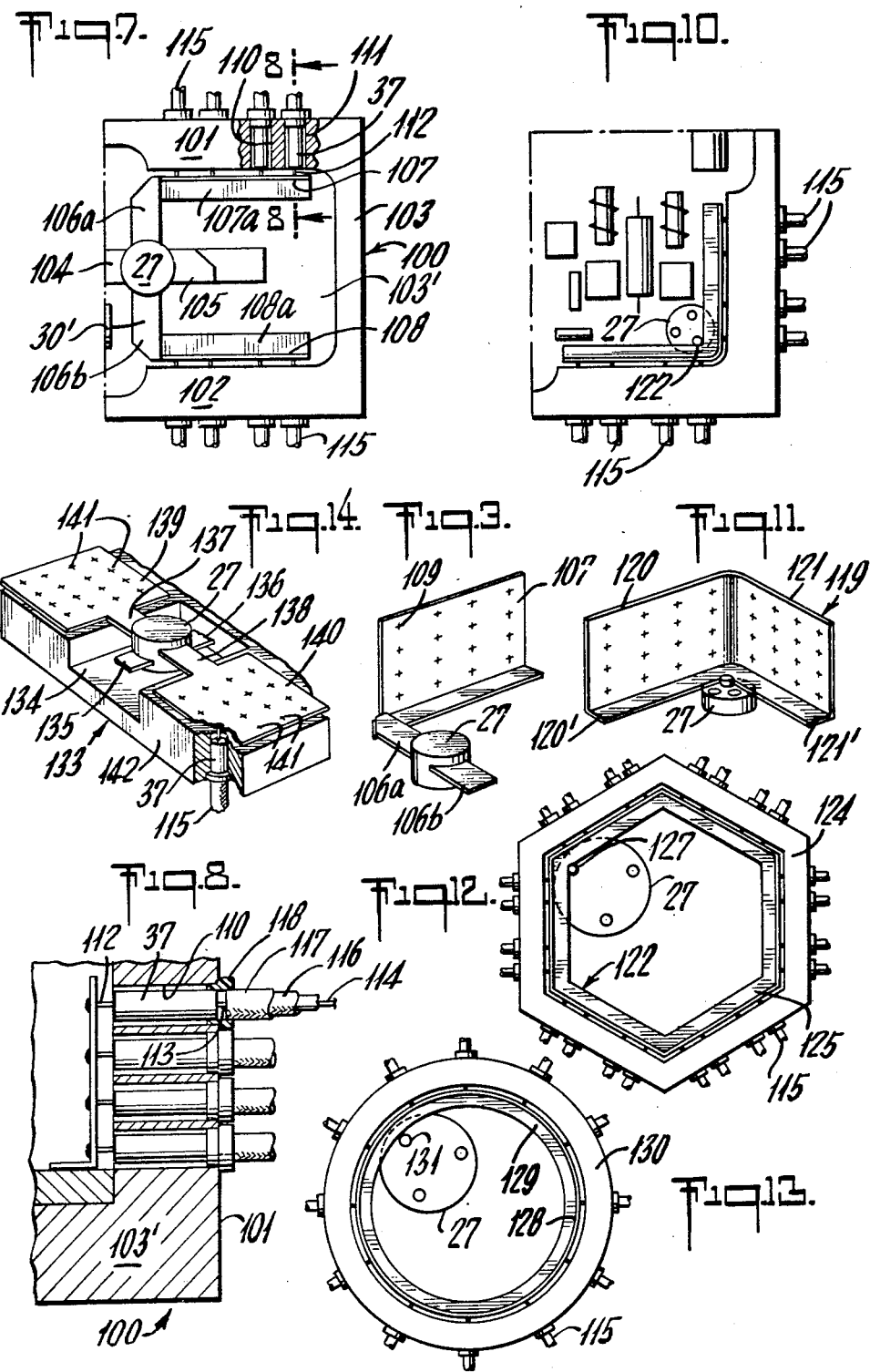

HIGH ISOLATION MULTICOUPLING APPARATUS

This application is a continuation-in-part of application Ser. No. 52,410 filed June 27, 1979 entitled: "High Isolation Multicoupling Apparatus", now U.S. Pat. No. 4,283,695, and a continuation-in-part of application Ser. No. 208,858 filed Nov. 21, 1980 entitled: "High Isolation Multicoupling Apparatus" now abandoned.

This invention relates to a high isolation multicoupling apparatus of the type generally utilized for producing a plurality of outputs from a single RF source such as an antenna or the like and more specifically to novel and improved apparatus which affords extremely high isolation between the plurality of outputs in addition to a high dynamic range of operation, substantially linear response and outputs substantially matched as to phase and amplitude.

Multicoupling devices and networks have been used in the past for connecting a single RF source to utilization devices such as receivers, indicating devices and the like. Known devices have generally been found unsatisfactory because of poor coupling efficiency, limited amplitude range of operation, high cross modulation products and the like. One such device utilizes a plurality of hybrid couplers each having a limited number of outputs. To increase the number of outputs, one of the outputs of the first coupler is used to feed a second similar coupler and successive couplers may be similarly connected. This procedure results in serious losses necessitating additional amplification and consequently additional power. Another form of a known multicoupler is disclosed in U.S. Pat. No. 3,187,259 granted June 1, 1965 to Scandurra et al. While this patent constitutes a material improvement over the prior art, the impedances of the output circuits are relatively high and the apparatus is relatively large and utilizes a substantial amount of power.

The multicoupler system in accordance with this invention overcomes the difficulties encountered with prior known devices and provides a novel and improved multicoupler affording high isolation between the outputs with a loss of less than 3 db between the input and the output and substantially linear response and can accommodate a large number of outputs from a single input with the number of outputs limited principally of physical conditions. As many as five-hundred or more outputs can easily be handled by a single system according to the invention.

Another object of the invention resides in the revision of a novel and improved multicoupler having a relatively wide dynamic range and an improved linearity and signal to noise ratio.

Still another object of the invention is to provide a novel and improved multicoupler characterized by its simplicity, efficiency, relatively low cost and compactness.

A further object of the invention resides in the provision of a novel and improved multicoupler which not only affords the advantages heretofore discussed but may also be arranged to effect cancellation of the even harmonics.

Still another object of the invention resides in the provision of a novel and improved RF multicoupler.

A still further object of the invention resides in the provision of a novel and improved method and structure for coupling a plurality of isolation networks to a single output terminal such as the output terminal of an active device or the like while maintaining inductive and capacitive effects at a substantially negligible magnitude.

The multicoupler in accordance with the invention comprises at least one active device such as an amplifier having one or more emitter followers connected in sequence and fed from an RF source through a matching network which steps up the input impedance from the source. When utilizing successive emitter followers, the output impedance of the first emitter follower may be of the order of 5 ohms and an impedance of less than 0.01 ohm may be produced at the output of the final emitter follower. The signal at the final emitter follower is then fed to the inputs of a plurality of isolation networks each preferably having a series input resistor. With this arrangement, isolation between outputs of the isolation networks throughout a frequency range of up to 32 MHZ and even higher will be greater than 45 decibels and as high as 59 or 60 decibels with a loss between the input of the multicoupler and each output of the isolation networks of less than 3 db. With the utilization of two multicouplers, cancellation of the even harmonics may also be effected. The invention further involves a structural arrangement for connecting the isolation networks to a single output utilizing signal distribution plates of appreciable dimensions which maintain capacitive and inductive effects at a negligible minimum. The plate or plates are coupled to the output of the active device by a lead of negligible length or the plate may form the output terminal of the active device. Each isolation network is coupled to the plate by a lead of negligible length.

The above and other objects and advantages of the invention will become more apparent from the following description and accompanying drawing forming part of this application.

IN THE DRAWINGS

FIG. 2 is a circuit diagram of a modified isolating network for use with the circuit of FIG. 1;

FIG. 3 is a circuit diagram of another embodiment of a multicoupler and isolating networks in accordance with the invention;

FIG. 4 is a circuit diagram of a modified isolation network for use with the circuit of FIG. 3;

FIG. 6 is a circuit diagram of still another embodiment of the invention which effects cancellation of even harmonics;

FIG. 7 is a plan view in partial section of an improved structural arrangement for connecting a plurality of isolation networks to the output of an amplifying element using signal distribution plates and a surrounding housing for shielding the plates and the individual resistive elements forming the inputs to the isolation networks;

FIG. 8 is a cross sectional view of FIG. 7 taken along the line 8—8 thereof;

FIG. 9 is a perspective view of the active device of FIG. 7 illustrating the coupling of the output thereof to a signal distribution plate;

FIG. 10 is a plan view of a modified signal distribution plate, its connection to the output of an active device and surrounding shielding means;

FIG. 11 is a perspective view of the signal distribution plate of FIG. 10 showing the connection of the plate to the output of the active device;

FIG. 12 is an enlarged plan view of a hexagonal signal distribution plate, the surrounding housing shielding the plate and resistive coupling means for each isolation network;

FIG. 13 is an enlarged plan view of another form of a signal distribution plate, similar to FIG. 12, including surrounding shielding means; and FIG. 14 is a perspective view of still another form of the signal distribution plate in accordance with the invention.

Figures 1, 5:
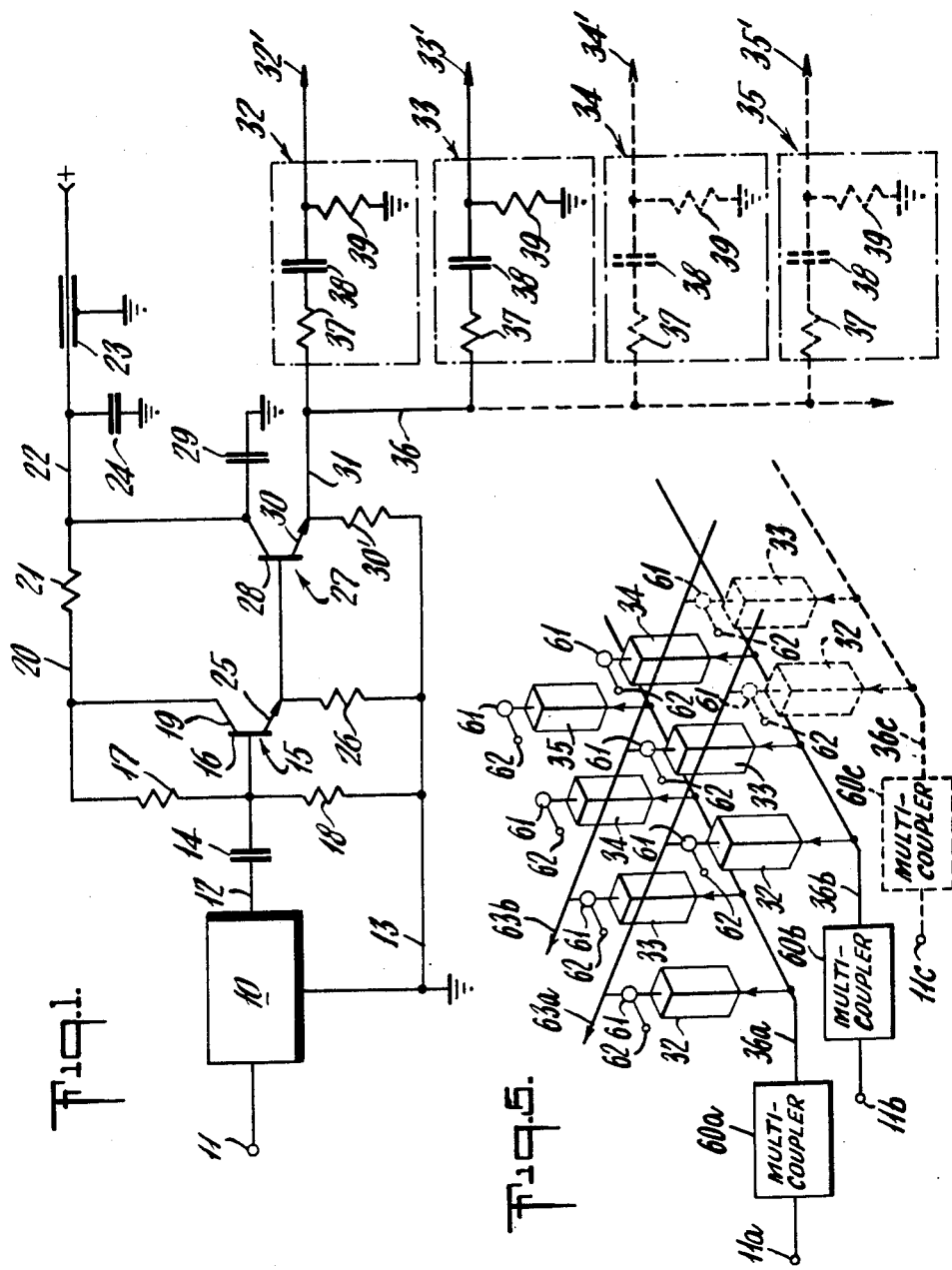
FIG. 1 is a circuit diagram of one embodiment of a multicoupler and isolating networks in accordance with the invention.
FIG. 5 is an enlarged diagrammatic perspective view of one embodiment of switching means in accordance with the invention.

A multicoupler in accordance with the invention as shown in FIG. 1 comprises a coupling network 10 having an input 11 for connection to an antenna or other source of radio frequency energy. While the network may take any desired form, it is preferably a transformer which will step-up the impedance from a source connected to the input 11 so that a relatively high impedance will appear between the output 12 and the ground conductor 13.

The output of the coupling network is connected through a capacitor 14 to the base 16 of the emitter follower 15. The base 16 of the emitter follower is biased by a pair of series connected resistors 17 and 18 connected between the conductor 20 and ground with the junction connected to the base 16. The collector 19 is also connected to conductor 20 which is in turn connected through a resistor 21 to conductor 22 and to the positive side of a DC voltage supply. The conductor 22 has a shield 23 which is grounded and a bypass capacitor 24 connected between conductor 22 and ground. The emitter 25 is connected to ground conductor 13 through a resistor 26 and to the base 28 of the second emitter follower 27.

The collector of the emitter follower 27 is connected to conductor 22 and is also bypassed to ground by a capacitor 29. The emitter 30 connected to the output conductor 31 is also returned to ground through resistor 30'.

In the operation of the circuit, a plurality of devices to be fed by a common input signal connected to terminal 11 are coupled to the conductor 31 through isolating networks generally denoted by the numerals 32 through 35 though as many as a hundred or more outputs and associated isolating networks may be utilized. The isolating networks may all be connected to a common conductor 36 and each network includes a series resistor 37 coupling the conductor 36 to a series capacitor 38. The output of each capacitor 38 is connected to its output terminal 32' to 35' respectively and is also shunted to ground by a resistor 39.

With the arrangement as described above, the output impedance of the emitter follower 15 will be less than 5 ohms and the second emitter follower output impedance measured from conductor 31 (36) to ground should be less than 1 ohm and preferably of the order of 0.01 ohm. When utilizing isolating networks wherein resistor 37 is greater than 100 ohms and the resistor 39 is greater than 150 ohms, the isolation between the outputs will be of the order of 45 to 60 decibels depending upon frequency with the greater isolation being experienced at the lower frequencies. At the same time, losses from the input 11 to the outputs 32' to 35' etc. will be less than 3 decibels and normally of the order of 1 decibel.

With the foregoing circuit which utilizes emitter followers for impedance transformation, an excellent dynamic range of operation is achieved since emitter followers are essentially linear devices. In addition, the circuit facilitates the utilization of a large number of outputs with exceedingly high isolating characteristics and low insertion losses of less than 3 decibels and generally of the order of 1 decibel. These advantages are also attained with minimum power requirements. A further advantage of the invention results from the fact that the entire unit including the isolating networks can be made exceedingly compact without afffecting the isolation characteristics of the outputs as will become apparent from the discussion of FIGS. 7 through 14. The use of the input coupling network also increases the signal input to the first emitter follower with the result that the signal to noise ratio is relatively large and renders the effect of noise virtually negligible. Further, the improved multicoupler in accordance with the invention affords broad band operation with substantially uniform frequency response and it is possible to effect an amplitude match of the order of 0.1 decibels.

Each of the isolating networks 32 through 35 as shown in FIG. 1 are essentially resistive networks and each uses a blocking capacitor 38 to block the DC potential on the emitter 30 from the output terminal such as terminals 32' through 35'. While each of the isolating circuits include a shunting output resistor 39, it is evident that these resistors can be replaced by any suitable type of impedance such as a choke or even a transformer, the latter being illustrated in FIG. 2.

It is known that inductive and capacitive effects in electronic circuits have a profound affect on linearity of the frequency response. For instance, a short length of wire in a wide band, high frequency circuit, of the type with which the circuitry of this invention is intended to be used, can cause serious inductive effects which vary with frequency thus interfering with the attainment of a linear response. Similarly, capacitors also change impedance with frequency and at the same time introduce serious inductive effects which increase with an increase in physical size and capacitance. Known multicouplers using active devices such as transistors all have output terminals at some DC potential and accordingly a single blocking capacitor is utilized between the output terminal and the isolating networks to prevent the application of DC to the input of the utilization devices. Under these conditions as the number of isolating networks is increased, the size of the blocking capacitor must be increased to minimize voltage or signal loss since the impedance of the capacitor is in series with the output of the active device. With increases in the value of the blocking capacitor, inductive effects are increased with the result that frequency linearity is severely affected.

With applicant's invention, each blocking capacitor 38 is individual to one isolation network and since it is in series with a resistor of 100 ohms or more, its size is negligible and its affect on linearity and magnitude of the signal can be neglected.

In FIG. 2, it will be observed that the shunting resistor 39 in each isolation network has been replaced by a transformer 40 having a primary 41 and a secondary 42. The impedance of the primary 41 may vary over a wide range, and, for example, if the resistor 37 and the impedance of the primary 41 are each approximately 500 ohms at a selected frequency as many as a thousand outputs can be obtained and the isolation between the outputs when more than two outputs are provided will be equal to or greater than the isolation obtained with the two outputs. The impedance of the secondary 42 would of course be selected to match the impedance of the utilization device. It is also evident that a choke may be utilized in place of the transformer 40 in which case the impedance of the choke would be governed by the characteristics of the utilization device.

In certain cases, it may be desirable to connect an attenuator or pad 43 in the output of the secondary 42 to obtain additional isolation. For instance, for each 3 decibels of attenuation an additional 6 decibels of isolation is obtained.

A modified form of the invention is illustrated in FIG. 3 and like numerals have been used to denote corresponding components of FIG. 1. This circuit differs from the circuit illustrated in FIG. 1 in that it employs a balanced power supply represented by the batteries 45 and 46 which are connected in series and the junction 47 is connected to ground. It is evident that any type of balanced voltage supply source may be utilized in place of the batteries 45 and 46.

The negative side of the battery 46 is connected to the conductor 13 which may be bypassed to ground by a capacitor 48. The positive side of the battery 45 is connected via a conductor 22' to the junction of resistor 21 and to the collector of the emitter follower 27. The conductor 22' also may be bypassed to ground by a capacitor 49. The bias for the base 16 of the emitter 15 is obtained by a series connected resistor 50 and diodes 51 and 52 which are connected between the conductor 20 and ground. Since the diodes will have a fixed voltage drop of 0.7 volts each, the potential at the junction of resistor 50 and diode 51 will be 1.4 volts. In as much as the base 16 of the transistor 15 is connected through resistor 18 to the junction of resistor 50 and diode 51, there will be a 1.4 volt positive bias on the base 16. The emitters 25 and 30 of transistors 15 and 27 each produce a 0.7 volt drop and since they are directly coupled, the emitter 30 will be at zero DC potential and the AC signal will appear between the emitter 30 and ground. This procedure avoids the need for the blocking capacitors 38 in the isolating networks 32 through 35 etc.

The isolating networks denoted herein by the numerals 32a through 35a etc. each include the series resistor 37 and a shunting choke 53 connected between one end of the resistor 37 and ground. As pointed out above, the choke 53 may have any desired impedance in order to match the utilization device. However, the lower the impedance of the choke 53, the fewer the number of isolating networks that can be used to feed individual utilization devices. As in the case of FIG. 1, it is to be understood that a resistor may be employed in place of the choke.

FIG. 4 illustrates a modified form of the isolation networks 32a through 35a etc. In this instance, the choke 53 has been replaced by a transformer 54 which functions in essentially the same manner as the transformer 40 illustrated in FIG. 2. The resistor 37 is connected in a series with the primary 55 of the transformer 54 and the secondary 56 is connected via the lead 57 to a utilization device. As pointed out above, the impedance of the primary 55 is selected to meet the needs of the system and can vary over a very wide range. It is understood however that when only a few isolating networks are to be utilized the value of the resistor 37 and the impedance of the primary 55 can be relatively low whereas the value of the resistor and the impedance of the primary would be made high when a large number of isolation networks are utilized. It is desirable that the input impedance of all of the parallel connected isolation networks should not be less than the output impedance of the final emitter follower 27.

As discussed in connection with FIG. 2, it may be desirable to increase the isolation between utilization devices connected to individual networks. For this purpose, a suitable attenuator or pad 58 may be connected between the secondary winding 56 and the utilization device in order to produce a preselected loss.

In addition to the numerous advantages afforded by the novel and improved multicouplers in accordance with the invention, these multicouplers greatly simplify the construction of switching means when it is desired to feed a plurality of inputs to selected utilization devices. The improved switching means is illustrated in FIG. 5 and is arranged to receive a plurality of inputs 11a, 11b, 11c, etc. and feed these input signals to selected output conductors 63a, 63b, etc. which are connected to individual utilization devices. The input signals are fed to multicouplers 60a, 60b, 60c, etc. which embody circuits such as shown in FIGS. 1 and 3 and the output signals are fed to transverse conductors 36a, 36, 36c, etc. Each of the transverse conductors are connected to a group of isolation networks 32, 33, 34, 35, etc. which may utilize any of the configurations previously described.

The outputs of all of the isolation networks 32 are each connected through individual switching means 61 to the output conductor 63a. Similarly, the utilization devices 33 are connected through switching devices 61 to the output conductor 63b and so on. There may be any number of input signals and any number of output conductors depending upon the requirements of any specific application. The switches 61 may either be mechanical or electrical, the latter taking the form of either a controlled diode or a transistor while the former may be a sub-miniature relay. The switches whether mechanical or electrical have terminals 62 for applying a control signal thereto so that each switch may be opened and closed by suitably modifying the signal applied to the control terminals 62. By reason of the fact that the isolation networks are exceedingly compact and since the multicouplers are also very compact, very little space is required for a matrix having a relatively large number of input signals which are to be selectively connected to a relatively large number of utilization devices. Known multicouplers cannot provide as compact a switching arrangement and thus as compact a total matrix as that illustrated in FIG. 5 and at the same time also afford the high degree of isolation, high dynamic range of operation and substantially linear response over such a wide range of frequencies. Frequency ranges can also be readily modified by merely providing a suitable input network 10 and when utilizing inductors such as chokes or transformers in the isolation networks selecting such chokes or transformers to function at the desired operating frequency.

FIG. 6 illustrates a further embodiment of the invention utilizing a pair of multicouplers which are arranged to effect cancellation of the even harmonics which may be contained in the input signal. In this form of the invention, a pair of emitter follower amplifiers 70 and 71 are utilized each of which is substantially identical to the emitter follower amplifier illustrated in FIG. 3 and like numerals are utilized to denote corresponding components in FIGS. 3 and 6. The input signal from an antenna or other source of high frequency is fed to the primary 73 of transformer 72. The impedance of the primary 73 is arranged to match the impedance of the source. The secondary 74 of transformer 72 has a grounded centertap 75 and the end terminals 76 and 77 are fed through conductors 78 and 79 to the input capacitors 14 of the amplifiers 70 and 71 respectively. In this form of the invention, the coupling network 10, as shown in FIG. 3, is not required as the transformer 72 functions to provide the relatively high output impedance to the coupling capacitors 14.

It is evident from the foregoing description that the amplifiers 70 and 71 may be active devices such as devices shown in FIGS. 1 or 3 though the form shown in FIG. 3 is preferred because the output conductors 31, in the absence of a signal, are at zero potential and thereby simplify the isolating networks 80a to 80n etc. and 81a to 81n etc. Although only four isolating networks are shown at the output of each amplifier any number of such networks may be utilized. In this form of the invention, the isolating networks 80a to 80n and 81a to 81n merely consist of series resistors 82a to 82n and 83a to 83n. One end of each of the resistors 82a to 82n is connected through a common conductor 84 to the output conductor 31 of the active device 70 while one end of each of the resistors 83a to 83n is connected through a common conductor 85 to the output conductor 31 of the active device 71.

The outputs from the isolating networks 80a to 80n and 81a to 81n are fed to transformers 86a to 86n of which only 86a to 86c are illustrated. More specifically, each of the transformers 86a to 86n has a centertapped primary 87 with the centertap 88 grounded and the end terminals connected through conductors 89 and 90 to isolating networks 80a and 81a respectively. The secondary 91 of each transformer 86a, 86b, etc. has a pair of output terminals 92 and 93 for connection to a utilization device. The remaining transformers 86b and 86n are similarly connected.

With the foregoing arrangement, cross modulation products of the 2nd order can be reduced by at least 20 decibels and at the same time if one of the active devices 70 or 71 should fail, operation of the system will not be interrupted.

The value of the resistors 82a to 82n and 83a to 83n can vary over a wide range as for instance 100 ohms to 1000 ohms and the transformers 86a to 86n may be designed to match the output impedance of the isolating networks with the input impedance of the utilization devices.

In all of the forms of the invention, isolation of the utilization devices from a single multicoupler in accordance with the invention is greater than 40 decibels over a wide range of frequencies. In addition, the multicoupler has substantially zero insertion loss and will provide any desired number of outputs from a single RF source with matched amplitude and phase characteristics.

As previously mentioned, it has been found that through the utilization of metal plates for the distribution of a signal from the output of an active device, such as those illustrated in FIGS. 1, 3 and 6, the introduction of adverse inductive effects experienced with normal wiring techniques will be avoided. For instance, a length of conventional electronic hook-up wire of as much as one-quarter inch between the input of an isolation network and the output of the active device, such as the emitter of a transistor, will interpose sufficient inductance to produce a material effect on the frequency response. By utilizing plates of material width and length which would be connected to the output terminal of the transistor or other active device either through a flat strip of material or in abutting relationship to the active device so that the lead wire from the active device which is soldered or otherwise affixed to the plate is of negligible length, inductive effects can virtually be eliminated. Examples of structural arrangements for coupling a plurality of isolation networks to the output emitter of an emitter follower amplifier to reduce inductive effects to a negligible quantity are illustrated in FIGS. 7 through 14.

FIGS. 7, 8 and 9 show the improved distribution system together with fragmentary portions of the housing and the associated amplifiers. The illustrated portion of the housing is denoted by the numeral 100 and includes side walls 101 and 102, end wall 103 and bottom wall 104. In as much as amplifier components normally contained within the illustrated housing portion 100 are not essential to an understanding of this aspect of the invention, since the amplifier was described in previous figures, only the output transistor 27 is illustrated and described. The housing portion 100 is preferably made of aluminum or other suitable material and the output transistor 27 is secured to the bottom 103' of the housing portion 100 by any suitable means. In accordance with the invention, the transistor 27 is provided with terminal portions in the form of flat metallic strips with the base being denoted by the numeral 104, the collector by the numeral 105 and the emitter by the numerals 106a and 106b. The emitter terminals 106a and 106b correspond to the emitter 30 as illustrated in the previous figures. The resistor 30' in FIG. 7 corresponds to the resistor 30' of the preceding figures. The signal distribution plates 107 and 108 are vertically disposed within the housing section 100 and spaced from the walls 101 and 102 thereof. A perspective view of the plate 107 is illustrated in FIG. 9 and it will be observed that the outer ends of the emitter terminals 106a and 106b are soldered or otherwise electrically coupled to the bottom flanges 107a and 108a of the distribution plates 107 and 108. Each of the plates 107 and 108 is provided with a group of openings or perforations 109 preferably arranged in a predetermined order to facilitate coupling of the isolation networks and the walls 101 and 102 of the housing 100 are provided with cylindrical openings 110 with each opening being aligned with one of the openings 109 in the associated plate 107 and 108. The openings 109 each accommodate an input resistor 37 (82, 83) of the isolation networks shown in the previous figures.

More specifically, each of the resistors 37 (82, 83) has a length slightly shorter than the width of the walls 101 and 102 and a diameter slightly less than the diameter of the openings 110. An insulating sleeve 111 may be positioned about each of the resistors 37 (82, 83) and each resistor with its sleeve is positioned within an opening 110 with the lead wire 112 extending through an aligned opening 109. The lead 112 is then soldered to the plate 107 or 108 as the case may be and the inner end cut very close to the plate. An enlarged section of the wall 101 with the resistors disposed within the openings 110 is illustrated more clearly in FIG. 8. It will be observed in FIG. 8 that the outer terminal 113 of each resistor is connected to the central lead wire 114 of coaxial cable 115 which includes, in addition to the shield 116, an outer sheath 117. The coaxial cable 115 is sealed to the opening 110 by a surrounding grommet 118 to minimize the accummulation of foreign matter in and about the resistor.

While the arrangement illustrated in FIGS. 7, 8 and 9 accommodates a total of thirty-two outputs, a variety of other configurations can be utilized to increase the number of outputs from a single active device. Alternate arrangements will be discussed in connection with FIGS. 10 through 14.

The form of the invention illustrated in FIGS. 7 and 9 is shown in substantially full scale and through the utilization of transistor terminals 106a and 106b and the distribution plates 107 and 108 inductive effects are virtually negligible and a plurality of outputs can be obtained. Since the resistors 37 (82, 83) are disposed in individual openings in the housing walls 101 and 102, the resistors are all shielded one from the others and through the utilization of coaxial cables 115 coupling the resistors to the remaining portions of the isolation networks as illustrated in the previous figures, all capacitive and inductive affects are maintained at negligible levels so that the signal outputs from each of the isolation networks are substantially linear and uniformly matched as to linearity, magnitude and phase.

FIGS. 10 and 11 illustrate a modified distribution plate structure. In this form of the invention, the distribution plate 119 is formed of two plate portions 120 and 121 integrally joined at 90 degrees one to the other and having flange portions 120' and 121'. The transistor 27 has an emitter terminal 122 in the form of a lead wire and the transistor is mounted immediately beneath the flanges 120' and 121' with the lead wire 122 at the corner of the two flanges. The lead wire is cut close to the surface of the flanges and soldered thereto so that negligible inductance is introduced between the transistor 27 and the distribution plate structure 119. Here again, the structures shown in FIGS. 10 and 11 are substantially full scale and in FIG. 10 certain of the amplifier components are diagrammatically illustrated as a description is not deemed necessary since the amplifier was described in detail in FIGS. 1 through 6.

In FIGS. 7 through 11 thus far described, the total of thirty-two outputs are obtainable. However, the distribution plates can be modified to accommodate a much greater number of outputs.

FIG. 12 is a plan view of a hexagonal structure having a hexagonal distribution plate 122 with each of the sides having provision for sixteen or more outputs 115. The distribution plate 122 is surrounded by a housing 124 also of hexagonal construction and spaced from the distribution plate 122 to maintain the capacity between the plate and the housing at a minimum. The signal plate 122 has an inwardly extending hexagonal flange 125 and the transistor 27 forming the output of the active device has its emitter terminal 127 soldered preferably to the junction of two of the linear portions of the flange 125. The transistor 27 would be mounted close to the underside of the flange 125 so that the length of the emitter lead 127 will be negligible. The remainder of the structure, that is the installation of the resistors and coupling of the resistors through coaxial cables to the remaining portion of the isolation networks, may be identical to that described in connection with the proceding figures.

With the arrangement shown in FIG. 12 and assuming that the structure has approximately the same height as the structure shown in FIGS. 7 and 10 for instances a total of ninety-six outputs can be accommodated. If desired, the housing 124 may be fabricated from hexagonal stock with an axial opening drilled therein. The distribution plate 122 would then be in the form of a cylinder disposed within and spaced from the walls of the openings.

FIG. 13 is a structure substantially identical to that illustrated in FIG. 12 with the exception that the distribution plate 128 is circular and includes an inwardly extending flange 129 and a circular housing 130 spaced from the plate 128 to minimize capacitance. The cylindrical structure can be made of any desired height and the outputs can be positioned about the circular structure at any desired intervals. As in the previous cases, the transistor 27 is positioned in close proximity to the underside of the flange 129 with the emitter output 131 positioned in adjoining relationship to and soldered to the flange. Again the length of the emitter lead 131 would be no longer than the thickness of the flange 129. If desired, a transistor as illustrated in FIGS. 7 and 9 may be used with the forms of the invention shown in FIGS. 10 through 13.

A still further form of the invention is illustrated in FIG. 14 which illustrates a fragmentary portion of a housing 133 having a central recessed portion 134 to accommodate the output transistor 27 of an active device having a base 135, a collector 136 and emitter output strips 137 and 138. In this embodiment of the invention, the metal strips are formed with enlarged end portions or plates 139 and 140. These plates are insulated from the housing 133 and include perforations 141 as in the case of the plates in the preceding embodiments of the invention. In addition, the base 142 of the housing 133 has a plurality of openings drilled therein and in alignment with the openings 141 in the plates 139 and 140 to accommodate resistors 37 and coaxial cables 115 as described in connection with the embodiment of the invention shown in FIGS. 7 through 9.

As pointed out above, the utilization of signal distribution plates connected to the output terminal of the active device by either a negligible length of wire or by a metal strip having appreciable width which is formed integrally with the output element of the active device, inductive effects are maintained at a negligible minimum. Furthermore through the utilization of a metal housing of appreciable thickness to accommodate the input resistors to each of the isolation networks, the resistors are individually shielded and can be connected to the distribution plate with a negligible length of wire extending from one end of the resistor. Since the resistors are positioned in closely spaced relationship to the distribution plate, any inductive or capacitive effects occurring at the output side of the resistor will be negligible in comparison to the resistance of the resistor and therefore coaxial cables can readily be employed to couple the output end of the resistor to the remaining circuitry of the isolation networks. Furthermore, a small capacitor to block direct current, if necessary, can be employed without materially affecting the frequency response of the signal at the output of the isolation network.

With the circuitry shown in FIGS. 1 through 6 and with the distribution systems illustrated in FIGS. 7 through 14, it is possible to provide a large number of isolated outputs (the number of outputs depending solely upon the area of the distribution plates) from a single input signal all of which are matched both as to phase and amplitude. At the same time, a substantially linear response is obtained throughout a wide frequency range from as low as 100 to 500 kilohertz to at least 50 to 100 megahertz. When very large numbers of outputs are required, a plurality of distribution structures as shown in FIGS. 12 and 13, for instance, may be employed. In this case, each distribution structure may be driven by a single transistor 27 which may be individually driven in the manner illustrated in FIGS. 1 and 3 or in the alternative a plurality of transistors 27 may be driven from a single transistor 15 in a manner well known in the art. Accordingly, five-hundred or more isolated outputs can be readily obtained from a single input all of which are substantially matched in both phase and amplitude and at the same time negligible insertion losses are experienced. Moreover, these ends can be achieved in a relatively small space and with very low power requirements.

While only certain embodiments of the invention have been illustrated and described, it is understood that alterations, changes and modifications can be made without departing from the true scope and spirit thereof.

The term direct-coupled, directly-coupled, directly-connected and the like as used in the claims are intended to have the meaning well known in the art namely that in such couplings neither blocking capacitors nor transformers are used. Thus the flow of direct current can occur between successive amplifying devices and between the last amplifying device and the load or loads connected to the output of the last amplifying device.

What is claimed is:

1. A multicoupler for coupling a single energy source to at least two or more utilization devices such as receivers and the like comprising a matching network having an input connected to said source and an output, a substantially frequency insensitive amplifier including at least one amplifying device having an output terminal, a high input impedance and a very low output impedance, a connection between the output of said matching network and the input of said amplifier, at least two passive isolation networks each having an input and an output for connection to a utilization device, and a direct coupling between the output terminal of said amplifying device and the input of each isolation network whereby each isolation network will directly view only the output impedance of the output terminal of said amplifying device in parallel with the input impedance of the other isolation network, said isolation networks each presenting a substantially resistive load to said amplifier, draw substantially zero DC current and produce outputs having substantially matched amplitude and phase characteristics.

2. A multicoupler according to claim 1 wherein said matching network comprises an impedance transformer for increasing the impedance of said source.

3. A multicoupler according to claim 1 wherein said isolation networks each comprise at least one impedance connecting the input thereof to the output thereof and at least one impedance in shunt with the last said output whereby the sum of said impedances forms the input impedance of said isolation network.

4. A multicoupler according to claim 3 wherein the first said impedance comprises a resistor and capacitor in series and said parallel impedance comprises a resistor.

5. A multicoupler according to claim 1 wherein the output impedance of said amplifier is of the order of 1 ohm.

6. A multicoupler according to claim 1 wherein the output impedance of said amplifier does not exceed 1 ohm.

7. A multicoupler for coupling a single energy source to at least two or more utilization devices such as receivers and the like comprising an impedance matching network having an input connected to said source and an output, a first emitter follower having an input terminal connected to the output of said network, a base, and an output terminal and a second emitter follower having an input terminal connected to the output terminal of the first emitter follower and an output terminal, at least two passive isolation networks coupling at least two utilization devices to the output terminal of said second emitter follower, each isolation network having an input directly-coupled to the output terminal of said second emitter follower and an output and each isolation network comprising at least one impedance connected between the input and output thereof and presenting a substantially resistive load to the output terminal of said second emitter follower and drawing substantially zero DC current, the impedance seen by each isolation network constituting the output impedance of said second emitter follower in parallel with the combined input impedance of the remaining isolation networks connected in parallel.

8. A multicoupler according to claim 7 wherein said impedance of each isolation network includes a resistor and said isolation network further includes an impedance connected across the output thereof.

9. A multicoupler according to claim 8 wherein the last said impedance is an inductive impedance.

10. A multicoupler according to claim 9 wherein said inductive impedance constitutes the primary of an impedance transformer.

11. A multicoupler according to claim 7 wherein the output impedance of the second emitter follower is of the order of 1 ohm.

12. A multicoupler according to claim 7 wherein the output impedance of the second emitter follower is less than 1 ohm.

13. A multicoupler according to claim 7 wherein said emitter followers are direct coupled, the base of the first said emitter follower is biased at 1.4 volts above ground and the emitter of said second emitter follower is at zero DC potential.

14. A multicoupler according to claim 1 including a signal distribution plate of appreciable area, substantially non-reactive means electrically connecting said plate to the output of said amplifier and connections of negligible length between the input of each isolation network and said distribution plate.

15. A multicoupler according to claim 14 wherein each of said isolation networks includes a series network having at least one resistive element connecting the input and output terminals thereof with one terminal of said isolation network comprising the input and means electrically connecting said one terminal of said isolation network to said signal distribution plate with a negligible length of conductor.

16. A multicoupler according to claim 15 wherein at least one of said series network elements has terminals extending from opposite ends thereof, and one end of said element is in closely abutting relationship to said plate.

17. A multicoupler for coupling a single energy source to at least two or more utilization devices such receivers and the like comprising a matching network having an input connected to said source and an output, a substantially frequency insensitive amplifier having a high input impedance and a very low output impedance, a connection between the output of said matching network and the input of said amplifier, at least two passive isolation networks each having an input and an output for connection to a utilization device, and a direct coupling between the output of said amplifier and the input of each isolation network whereby each isolation network will directly view only the output impedance of the amplifier in parallel with the input impedance of the other isolation network, said isolation networks each presenting a substantially resistive load to said amplifier and producing outputs having substantially matched amplitude and phase characteristics, a signal distribution plate of appreciable area, substantially non-reactive means electrically connecting said plate to the output of said amplifier and connections of negligible length between the input of each isolation network and said distribution plate, each of said isolation networks includes a series network having at least one resistive element connecting the input and output terminals thereof with one terminal of said isolation network comprising the input and means electrically connecting said one terminal of said isolation network to said signal distribution plate with a negligible length of conductor, at least one of said series network elements having terminals extending from opposite ends thereof, and one end of said element is in closely abutting relationship to said plate, said plate being positioned within a housing having at least one wall of substantial thickness, said distribution plate is positioned adjoining said wall and has a plurality of spaced openings to receive said element leads and said wall has a plurality of openings aligned with the openings in said plate to accommodate said elements.

18. A multicoupler for coupling a single energy source to at least two or more utilization devices such as receivers and the like comprising a matching network having an input connected to said source and an output, a substantially frequency insensitive amplifier having a high input impedance and a very low output impedance, a connection between the output of said matching network and the input of said amplifier, at least two passive isolation networks each having an input and an output for connection to a utilization device, and a direct coupling between the output of said amplifier and the input of each isolation network whereby each isolation network will directly view only the output impedance of the amplifier in parallel with the input impedance of the other isolation network, said isolation networks each presenting a substantially resistive load to said amplifier and producing outputs having substantially matched amplitude and phase characteristics, a signal distribution plate of appreciable area, substantially non-reactive means electrically connecting said plate to the output of said amplifier and connections of negligible length between the input of each isolation network and said distribution plate, said signal distribution plate including at least two interconnected portions angularly disposed one relative to the other.

19. A multicoupler according to claim 18 wherein said signal distribution plate is polygonal.

20. A multicoupler for coupling a single energy source to at least two or more utilization devices such as receivers and the like comprising a matching network having an input connected to said source and an output, a substantially frequency insensitive amplifier having a high input impedance and a very low output impedance, a connection between the output of said matching network and the input of said amplifier, at least two passive isolation networks each having an input and an output for connection to a utilization device, and a direct coupling between the output of said amplifier and the input of each isolation network whereby each isolation network will directly view only the output impedance of the amplifier in parallel with the input impedance of the other isolation network, said isolation networks each presenting a substantially resistive load to said amplifier and producing outputs having substantially matched amplitude and phase characteristics, a signal distribution plate of appreciable area, substantially non-reactive means electrically connecting said plate to the output of said amplifier and connections of negligible length between the input of each isolation network and said distribution plate, said signal distribution plate being circular.

21. A multicoupler for coupling a single energy source to at least two or more utilization devices such as receivers and the like comprising a matching network having an input connected to said source and an output, a substantially frequency insensitive amplifier having a high input impedance and a very low output impedance, a connection between the output of said matching network and the input of said amplifier, at least two passive isolation networks each having an input and an output for connection to a utilization device, and a direct coupling between the output of said amplifier and the input of each isolation network whereby each isolation network will directly view only the output impedance of the amplifier in parallel with the input impedance of the other isolation network, said isolation networks each presenting a substantially resistive load to said amplifier and producing outputs having substantially matched amplitude and phase characteristics, a signal distribution plate of appreciable area, substantially non-reactive means electrically connecting said plate to the output of said amplifier and connections of negligible length between the input of each isolation network and said distribution plate, said amplifier including an output transistor with the output terminal forming the output of said amplifier being in the form of a flat strip of conductive material connected to said distribution plate.

22. A multicoupler according to claim 21 wherein said flat strip comprises said signal distribution plate.

23. Means for feeding a high frequency signal from at least one output terminal of an amplifying device to a plurality of utilization devices with the introduction of negligible reactive effects comprising a signal distribution plate of conductive material and appreciable area and negligible thickness as compared to the area, means having negligible reactance connecting said terminal to said distribution plate, a plurality of isolation networks each having an input and output terminal and a series network including at least a resistive element connecting said terminals, a substantially non-reactive coupling between the input of each isolation network and said distribution plate with one element of said series network positioned with said one end in close abutting relationship to said plate, means connecting the output terminals of each of said isolation networks to a utilization device, and means electromagnetically shielding each of said one elements one from the others.

24. Means for feeding a high frequency signal to a plurality of utilization devices according to claim 23 wherein said shielding means comprises a wall of appreciable thickness positioned in closely spaced insulating relationship to said plate and having a plurality of openings extending therethrough and the last said elements being disposed in insulating relationship to and within said openings.

25. Means for feeding a high frequency signal to a plurality of utilization devices according to claim 23 wherein the first said terminal comprises the output terminal of a transistor in the form of a conductive strip having appreciable width as compared to its thickness.

26. Means for feeding a high frequency signal to a plurality of utilization devices according to claim 23 wherein said distribution plate is polygonal in cross section.

27. Means for feeding a high frequency signal to a plurality of utilization devices according to claim 23 wherein said distribution plate is cylindrical.

28. Means for feeding a high frequency signal to a plurality of utilization devices according to claim 23 wherein said series network further includes a capacitive element.

29. Means for feeding a high frequency signal to a plurality of utilization devices according to claim 23 wherein the last said connecting means includes an impedance connected between the other end of each of said one elements and ground.

30. A multicoupler according to claim 23 wherein said series network has input and output terminals and includes a capacitive element and a resistor element connected in series.

31. A multicoupler according to claim 30 wherein said plate is positioned within a housing having at least one wall of substantial thickness, said distribution plate is positioned adjoining said wall and has a plurality of spaced openings for attachment of one terminal of each network and said wall has a plurality of openings each aligned with the openings in said plate to accommodate one of said elements.

* * * * *